(12) United States Patent
Sommer et al.

(10) Patent No.: US 9,361,951 B2
(45) Date of Patent: Jun. 7, 2016

(54) STATISTICAL PEAK-CURRENT MANAGEMENT IN NON-VOLATILE MEMORY DEVICES

(71) Applicant: Apple Inc., Cupertino, CA (US)

(72) Inventors: Naftali Sommer, Rishon le-Zion (IL); Stas Mouler, Kfar Saba (IL); Eyal Gurgi, Petah-Tikva (IL); Yoav Kasorla, Kfar Netar (IL); Liran Erez, Petah-Tikwa (IL)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/468,661

(22) Filed: Aug. 26, 2014

(65) Prior Publication Data

US 2015/0199999 A1      Jul. 16, 2015

Related U.S. Application Data

(60) Provisional application No. 61/927,059, filed on Jan. 14, 2014.

(51) Int. Cl.
| G11C 5/14 | (2006.01) |
| G11C 16/32 | (2006.01) |
| G11C 16/10 | (2006.01) |
| G11C 16/12 | (2006.01) |
| G11C 16/30 | (2006.01) |

(52) U.S. Cl.
CPC .... *G11C 5/14* (2013.01); *G11C 5/147* (2013.01); *G11C 16/32* (2013.01); *G11C 5/145* (2013.01); *G11C 16/10* (2013.01); *G11C 16/12* (2013.01); *G11C 16/30* (2013.01)

(58) Field of Classification Search
CPC .................................. G11C 5/14; G11C 5/147
See application file for complete search history.

(56) References Cited

U.S. PATENT DOCUMENTS

| 6,134,145 | A | * | 10/2000 | Wong | 365/185.22 |
| 7,196,950 | B2 | * | 3/2007 | Kanda et al. | 365/194 |
| 7,701,764 | B2 | * | 4/2010 | Nguyen | 365/185.11 |
| 7,746,719 | B2 | * | 6/2010 | Kang | 365/225.7 |
| 8,090,898 | B2 | | 1/2012 | Chew et al. | |
| 8,243,546 | B2 | | 8/2012 | Warren | |
| 8,572,423 | B1 | | 10/2013 | Isachar et al. | |
| 8,583,947 | B2 | | 11/2013 | Byom et al. | |
| 8,645,723 | B2 | | 2/2014 | Seroff | |
| 8,861,298 | B2 | * | 10/2014 | Shibata | G11C 5/147 365/226 |
| 8,908,463 | B1 | * | 12/2014 | Fukuda | 365/227 |
| 8,929,170 | B2 | * | 1/2015 | Park | G11C 5/14 365/227 |
| 2012/0063234 | A1 | * | 3/2012 | Shiga | G11C 16/30 365/185.22 |
| 2012/0265949 | A1 | * | 10/2012 | Shimizu | G06F 13/1689 711/154 |
| 2012/0331207 | A1 | | 12/2012 | Lassa et al. | |
| 2013/0301372 | A1 | | 11/2013 | Park et al. | |
| 2014/0047200 | A1 | | 2/2014 | Isachar et al. | |

FOREIGN PATENT DOCUMENTS

| WO | 2011085357 | 7/2011 |
| WO | 2014018264 | 1/2014 |

\* cited by examiner

*Primary Examiner* — Vanthu Nguyen
(74) *Attorney, Agent, or Firm* — Meyertons, Hood, Kivlin, Kowert & Goetzel, P.C.

(57) ABSTRACT

A method includes, in a storage system that includes multiple memory devices, holding a definition of a given type of storage command. Multiple storage commands of the given type are executed in the memory devices, such that an actual current consumption of each storage command deviates from a nominal current waveform defined for the given type by no more than a predefined deviation, and such that each storage command is preceded by a random delay.

17 Claims, 3 Drawing Sheets

STATISTICAL PEAK-CURRENT MANAGEMENT IN NON-VOLATILE MEMORY DEVICES

CROSS-REFERENCE TO RELATED APPLICATIONS

This application claims the benefit of U.S. Provisional Patent Application 61/927,059, filed Jan. 14, 2014, whose disclosure is incorporated herein by reference.

FIELD OF THE INVENTION

The present invention relates generally to memory devices, and particularly to methods and systems for controlling peak current consumption in memory devices.

BACKGROUND OF THE INVENTION

In some storage systems, the execution of storage commands may result in temporal high power or current consumption. Methods for limiting power consumption in storage systems are known in the art. For example, U.S. Pat. No. 8,090,898, whose disclosure is incorporated herein by reference, describes a nonvolatile memory system that has a controller chip connected to a memory medium and to several nonvolatile memory chips. The memory medium stores program codes for the controller chip to distribute an operation of the nonvolatile memory chips upon an instruction over time, so as to decentralize the peak current caused by the operation and thereby improve the stability of the system.

U.S. Patent Application Publication 2013/0301372, whose disclosure is incorporated herein by reference, describes a power management method that includes receiving a first command with first address indicating a first high power operation that is immediately executed in a first memory die. After receipt of the first command, receiving a second command with a second address indicating a second high power operation, such that an immediate execution of the second high power operation would overlap the first high power operation. Execution of second high power operation is delayed until completion of the first high power operation.

U.S. Pat. No. 8,645,723, whose disclosure is incorporated herein by reference, describes systems and methods for controlling power consumption in a system having multiple NVM dies, using asynchronous management of access requests. An arbiter of the system receives multiple requests to draw current, each request may be associated with a different NVM die. In some embodiments, the arbiter serves the requests based on their time of arrival using, for example, a first-in, first-out serving scheme. In other embodiments, the arbiter can serve multiple requests simultaneously, if not exceeding a power budget.

SUMMARY OF THE INVENTION

An embodiment of the present invention provides a method including, in a storage system that includes multiple memory devices, holding a definition of a given type of storage command. Multiple storage commands of the given type are executed in the memory devices, such that an actual current consumption of each storage command deviates from a nominal current waveform defined for the given type by no more than a predefined deviation, and such that each storage command is preceded by a random delay.

In some embodiments, the actual current consumption and the nominal current waveform each includes one or more current peaks, and the predefined deviation corresponds to deviation in one or more parameters characterizing the current peaks. In other embodiments, the predefined deviation defines a maximal difference between a first number of the current peaks in the actual current consumption and a second number of the current peaks in the nominal current waveform. In yet other embodiments, the predefined deviation defines a maximal difference between gap interval durations that separate adjacent current peaks in the actual current consumption and in the nominal current waveform.

In an embodiment, the predefined deviation defines a maximal difference between respective widths of the current peaks in the actual current consumption and in the nominal current waveform. In another embodiment, executing the storage commands includes generating the random delay using a pseudo-random number generator.

There is additionally provided, in accordance with an embodiment of the present invention, a storage system including multiple memory devices and storage circuitry. The storage circuitry is configured to hold a definition of a given type of storage command, to execute in the memory devices multiple storage commands of the given type, such that an actual current consumption of each storage command deviates from a nominal current waveform defined for the given type by no more than a predefined deviation, and to precede each of the storage commands by a random delay.

The present invention will be more fully understood from the following detailed description of the embodiments thereof, taken together with the drawings in which:

DETAILED DESCRIPTION OF EMBODIMENTS

Overview

Figure 1:
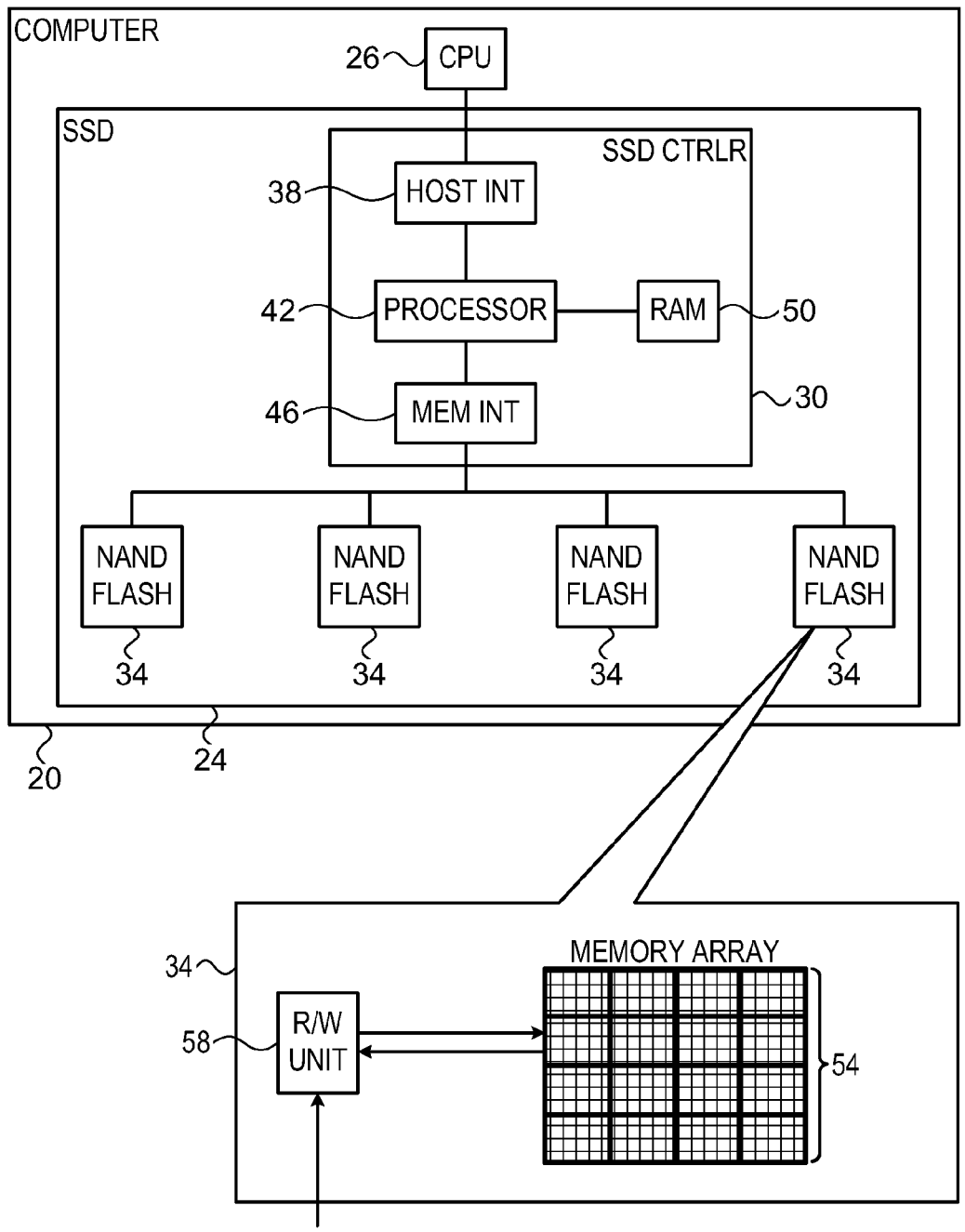
FIG. 1 is a block diagram that schematically illustrates a host system that stores data in a memory system, in accordance with an embodiment of the present invention.

Peak current consumption is an important figure-of-merit and a major consideration in the design of memory devices and memory systems in general. Peak current consumption has an impact, for example, on power supply design as well as on inter-operability between different vendors and device generations.

A typical Flash device comprises a large array of analog memory cells having rows associated with word lines and columns associated with bit lines. Execution of a storage command, such as a page read command, page write command or block erase command, typically involves a sequence of internal operations in the memory device. Some of these internal operations, such as charging and discharging of bit lines or iterative programming and verification, incur high peak current. In a typical memory system, a memory controller stores data in multiple memory devices, e.g., multiple Flash dies. In this sort of system, current peaks of different memory devices may coincide, causing high peak current consumption of the system as a whole.

Embodiments of the present invention that are described herein provide improved methods and systems for reducing the peak current consumption of a memory system. In the disclosed embodiments, the memory system is implemented using two principles:

- In the memory device, the sequence of internal operations that make-up a storage command (e.g., a write command) is implemented such that current consumption is a deterministic function of time. For example, when executing a write command, the current consumption as a function of time is not data-dependent or address-dependent. (In practice it is often difficult to ensure that the current consumption is 100% deterministic. Therefore, in some embodiments the definition of "deterministic" is slightly relaxed. Several examples of possible relaxations are described below.)
- The initial latency of starting to execute a storage command changes in a random manner. The random latency can be implemented either in the memory device or in the memory controller.

These two conditions can be combined into one: For a given type of storage command, the current consumption of a memory device is a deterministic function of time, except for an initial latency that changes at random from one command execution to another.

When implementing a memory system using the above combined condition, the statistical distribution of the overall current consumption of the system is well defined and can be controlled. For example, it is possible to calculate the probability that the overall temporal current consumption will exceed a certain threshold, and design power supply circuitry accordingly.

In the description that follows, the term "power peak" (or similarly a current peak) refers to a local increase in the power consumption, so that the power value exceeds a predefined criterion. For example, a power peak may be defined as an event in which the power consumption exceeds a predefined power value. Alternatively or additionally, the power peak may be defined as an event in which the power consumption increases to a value within a predefined fraction (e.g., 10%) of the maximal power consumption of the memory device or of the entire memory system. The peak time typically refers to the time in which the peak reaches its local maximal value. The peak width refers, for example, to the interval during which the power consumption exceeds the predefined criterion. Other suitable definitions can also be used.

System Description

FIG. 1 is a block diagram that schematically illustrates a host system that stores data in a memory system, in the present example a computer 20 that stores data in a Solid State Drive (SSD) 24, in accordance with an embodiment of the present invention.

In alternative embodiments, the host system may comprise, for example, a computing device, a cellular phone or other communication terminal, a digital camera, a music or other media player and/or any other system or device in which data is stored and retrieved.

In the present example, computer 20 comprises a Central Processing Unit (CPU) 26 that stores data in SSD 24. SSD 24 comprises an SSD controller 30 that stores data on behalf of CPU 26 in multiple non-volatile memory devices, in the present example NAND Flash devices 34. Although in the present example SSD 24 comprises four NAND Flash devices 34, in alternative embodiments any other suitable number of memory devices can be used.

SSD controller 30 comprises a host interface 38 for communicating with CPU 26, a processor 42 that carries out the various processing tasks of the SSD, a memory interface 46 for communicating with memory devices 34, and a Random Access Memory (RAM) 50. Each memory device 34 comprises an array 54 of analog memory cells, and a Read/Write (R/W) unit 58 that programs, reads and erases the memory cells in array 54.

In the context of the present patent application, the term "analog memory cell" is used to describe any memory cell that holds a continuous, analog value of a physical parameter, such as an electrical voltage or charge. Array 54 may comprise analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells.

The charge levels stored in the cells and/or the analog voltages or currents written into and read out of the cells are referred to herein collectively as analog values, analog storage values or storage values. The storage values may comprise, for example, threshold voltages or any other suitable kind of storage values. R/W unit 58 stores data in the analog memory cells by programming the cells to assume respective programming states, which are also referred to as programming levels. The programming states are selected from a finite set of possible states, and each programming state corresponds to a certain nominal storage value. For example, a 3 bit/cell Multi-Level Cell (MLC) can be programmed to assume one of eight possible programming states by writing one of eight possible nominal storage values into the cell.

Typically, R/W unit 58 converts data for storage in the memory device to analog storage values and writes them into the memory cells. In alternative embodiments, the R/W unit does not perform the conversion, but is provided with voltage samples, i.e., with the storage values for storage in the cells. When reading data out of array 54, R/W unit 58 converts the storage values of the memory cells into digital samples having a resolution of one or more bits. Data is typically written to and read from the memory cells in groups that are referred to as pages. In some embodiments, the R/W unit can erase a group of cells by applying one or more negative erasure pulses to the cells. Erasure is typically performed in entire memory blocks.

The disclosed techniques can be carried out by SSD controller 30 and/or by R/W units 58 in the multiple memory devices. Any functional partitioning between the two elements can be used. Thus, in the context of the present patent application and in the claims, the term "storage circuitry" collectively refers to SSD controller 30, R/W units 58, or both.

SSD controller 30, and in particular processor 42, may be implemented in hardware. Alternatively, the SSD controller may comprise a microprocessor that runs suitable software, or a combination of hardware and software elements.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

In the exemplary system configuration shown in FIG. 1, memory devices 34 and SSD controller 30 are implemented as separate Integrated Circuits (ICs). In alternative embodiments, however, the memory devices and the SSD controller may be integrated on separate semiconductor dies in a single Multi-Chip Package (MCP) or System on Chip (SoC), and may be interconnected by an internal bus. Further alternatively, some or all of the SSD controller circuitry may reside on the same die on which the memory array is disposed. Further alternatively, some or all of the functionality of SSD controller 30 can be implemented in software and carried out by a processor or other element of the host system. In some embodiments, CPU 26 and SSD controller 30 may be fabricated on the same die, or on separate dies in the same device package.

In some embodiments, SSD controller 30 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory. SSD controller 30 is also referred to herein as a memory controller.

In an example configuration of array 54, the memory cells are arranged in multiple rows and columns, and each memory cell comprises a floating-gate transistor. The gates of the transistors in each row are connected by word lines, and the sources of the transistors in each column are connected by bit lines. The memory array is typically divided into multiple pages, i.e., groups of memory cells that are programmed and read simultaneously. Pages are sometimes sub-divided into sectors. In some embodiments, each page comprises an entire row of the array. In alternative embodiments, each row (word line) can be divided into two or more pages. For example, in some devices each row is divided into two pages, one comprising the odd-order cells and the other comprising the even-order cells. In some embodiments, the memory cells are arranged in a three-dimensional (3-D) configuration.

Typically, memory controller 30 programs data in page units, but erases entire memory blocks. Typically although not necessarily, a memory block is on the order of $10^7$ memory cells, whereas a page is on the order of $10^4$-$10^5$ memory cells. In some embodiments, a given memory die comprises multiple memory arrays that are referred to as planes, and it is possible to program multiple pages into multiple respective planes in parallel.

Statistical Management of Peak Current Consumption

Typically, R/W unit 58 executes a given type of storage command (e.g., a write command or a read command) by performing a series of internal operations. A write command in a certain word line, for example, is executed by performing an iterative sequence of programming and verification (P&V) iterations. In each P&V iteration, the R/W unit applies a programming pulse to the selected word line, and then biases the various (e.g., selected and unselected) word lines and senses all the bit lines to determine which cells have reached their target programming level. Other types of storage commands (e.g., read commands or erase commands) are characterized by other sequences of internal operations performed by the R/W unit. In an MLC memory, commands applied to different significance bits (e.g. LSB write Vs. MSB write) are typically executed using different operation sequences.

When the R/W unit executes a given storage command, the current consumed by the memory device typically has a variable, burst-like behavior as a function of time, depending on the sequence of internal operations. In certain instances the current consumption is high, e.g., when applying programming pulses or when charging the bit lines in order to sense them. At other times the current consumption is low, e.g., immediately before or after a programming pulse or sense operation. In order to control and reduce the overall peak current consumption of SSD 24, it is desirable to avoid scenarios in which current peaks occur simultaneously in multiple memory devices 34.

In some embodiments of the present invention, SSD 24 controls peak current (or power) consumption by enforcing two conditions:

The sequence of internal operations that make-up a storage command is implemented in each memory device 34 such that current consumption is a deterministic function of time.

The initial latency of starting to execute a storage command changes in a random manner.

These two conditions can be combined into one: In some embodiments, when executing a given type of storage command, the current consumption of a memory device is a deterministic function of time, except for an initial latency that changes at random from one command execution to another.

Note that the parameters that characterize individual power peaks, such as the actual magnitude of a peak and its waveform shape, may be of secondary importance. For example, it is advantageous to control the timing of power peaks created in different memory devices so that they are not aligned in time, regardless of the magnitudes and shapes of the individual peaks (which may remain non-deterministic). The disclosed techniques therefore refer mainly to deterministic timing parameters such as peak width and gap intervals between adjacent peaks.

The term "deterministic function of time" means that parameters such as the width of current peaks and time gaps between power peaks are deterministic and do not depend, for example, on the data or on the address of the command. In a conventional memory device, the current consumption is not deterministic as a function of time. For example, gaps between current peaks may vary because the process is controlled by software, because of data dependencies, or for various other reasons. Memory devices 34 in the disclosed embodiments, on the other hand, are specifically designed such that current consumption will behave deterministically as a function of time. This condition can be met, for example, by fixing the gaps between current peaks to the worst-case (largest) values, and/or by performing the storage process entirely using hardware control.

Figure 2:
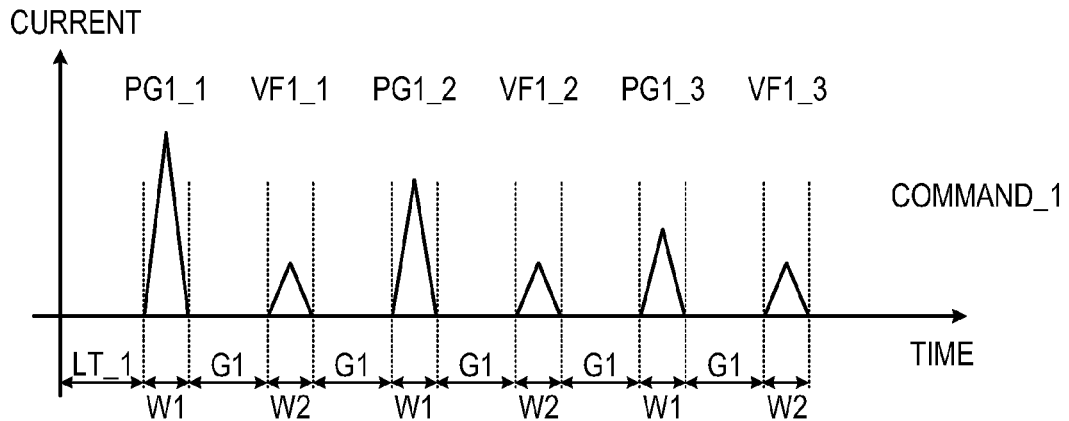
FIG. 2 is a diagram that schematically illustrates three waveforms of current consumption in a memory device, in accordance with an embodiment of the present invention.
Figure 2:
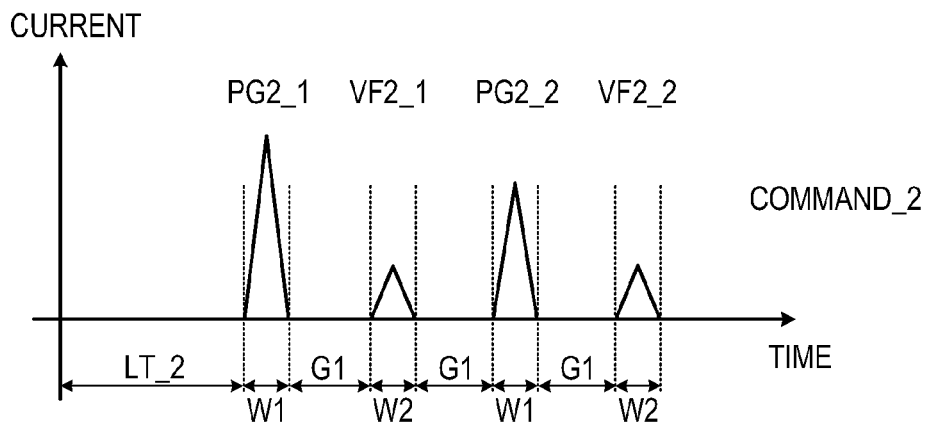
Figure 2:
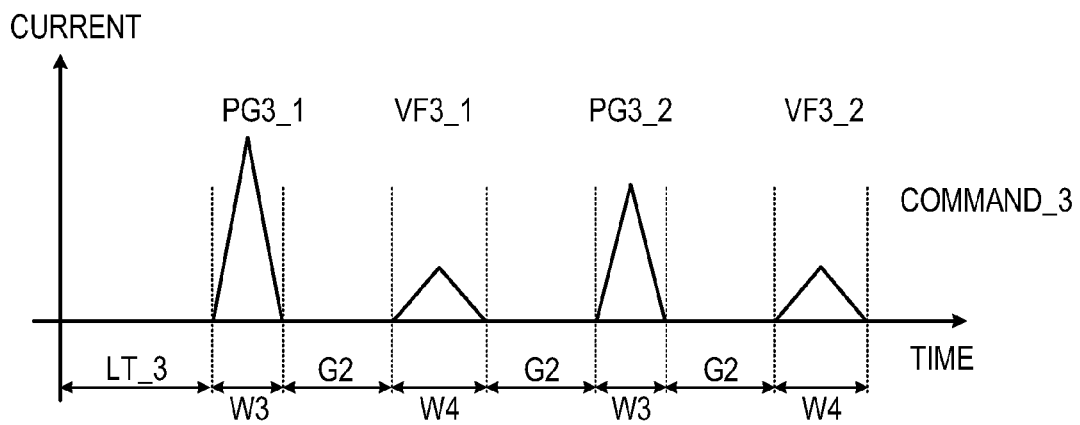

FIG. 2 is a diagram that schematically illustrates three waveforms of current consumption in a memory device, in accordance with an embodiment of the present invention. Each waveform in FIG. 2 depicts an example waveform of the current consumption that evolves in memory device 34 during the execution of a respective write command COMMAND_1, COMMAND_2 or COMMAND3. In the present example, the three write commands share a common type of storage commands (e.g., writing a LSB page). Even though the three current waveforms differ from one another, they can be regarded deterministic as a function of time with respect to the storage command type as explained below. In other words, the maximal deviation among multiple current waveforms that result by multiple executions of a storage command of a given type is limited to some predefined deviation.

When memory device 34 executes COMMAND_1, R/W unit 58 applies three P&V iterations. PG1_1 . . . PG1_3 denote peaks of current consumption during the programming phase, and VF_1 . . . VF_3 denote the current peaks created during the verification phase, in which the memory controller typically reads the programmed memory cells using a single read threshold. In this example, the widths of the PG and VF current peaks are denoted W1 and W2, respectively. G1 denotes the gap intervals between adjacent current peaks, in which the current consumption is relatively low.

In contrast to COMMAND_1, when memory device 34 executes write COMMAND_2, R/W unit 58 applies only two P&V iterations, which may indicate, for example, faster convergence to the target programming levels. PG2_1 and PG2_2 denote the current peaks of width W1 during the programming phase, and VF2_1 and VF2_2 denote the current peaks of width W2 during verification. The gap intervals duration between adjacent current peaks is the same as in COMMAND_1, i.e., G1.

The execution of COMMAND_3 results in three P&V iterations as in COMMAND_1. The widths of the current peaks at the programming and verification phases, however, are now W3>W1, and W4>W2, respectively, and the gap duration between adjacent peaks is now G2>G1.

As noted above, in practical memory devices it is difficult to ensure that the current consumption is 100% deterministic as a function of time. Therefore, in some embodiments, the term "deterministic function of time" means that the sequence of internal operations will be sufficiently deterministic between different dies such that the statistical distribution of the overall system current consumption is well defined and controllable.

For example, when executing COMMAND_1 and COMMAND_2 in FIG. 2, the gap interval G1 between peaks of current is deterministic, even though the number of peaks may vary. As another example, the sequence of internal operations may be deterministic within some permissible tolerance. For example, the gap intervals between current peaks and/or the widths of the peaks may be deterministic up to a certain permissible deviation (e.g., ±10%) from some nominal gap duration or peak width.

For example, the gap difference between G1 and G2 related to COMMAND_1 and COMMAND_3, respectively, as well as the width differences between W1 and W3, and between W2 and W4 should be below the permissible deviation. All of these example conditions are considered to result from internal operation sequences in which the current is a deterministic function of time.

The second condition (random initial latency) can be implemented either in R/W unit 58 or in SSD controller 30. The term "random initial latency" means that the delay from issuing a storage command until the R/W unit begins to execute the corresponding sequence of internal operations varies statistically from one command execution to another. In this context, pseudo-random latency is considered a type of random latency. In FIG. 2, the random latencies are denoted LT_1, LT_2, and LT_3.

In some embodiments, the random initial latency is implemented using a programmable delay line that is controlled by a pseudo-random number generator. On every storage command, the pseudo-random number generator generates a pseudo-random number, and the programmable delay line delays the command by a delay that is based on the random number. The pseudo-random number generator may comprise, for example, a Linear Feedback Shift Register (LFSR). As noted above, the random initial latency can be introduced either in the memory device or in the SSD controller.

In an example embodiment, the duration of a write command is on the order of 1.5 mS. The command is made-up of multiple internal operations that result in current peaks that are spaced apart by gaps on the order of 100 µS. A typical duration of a current peak is on the order of 5 µS. The random initial latency is typically selected in the range of zero to 100 µS, with a resolution of 1 µS. These parameters, however, are given purely by way of example. Any other suitable parameters can be used in alternative embodiments.

The three storage commands and respective current waveforms depicted in FIG. 2 are exemplary and other storage commands with respective deterministic current are also applicable. For example, read and erase commands may result in other current waveforms that also represent deterministic current consumption. As another example, the gap duration (e.g., G1) and/or peak widths (e.g., W1 and W2) may vary within a given waveform up to some predefined maximal deviation. Although the current peaks in FIG. 2 are schematically shown as triangle peaks, in practice the current peaks may have any other suitable shape. For example, a peak may comprise a sequence of multiple sub-peaks.

Figure 3:
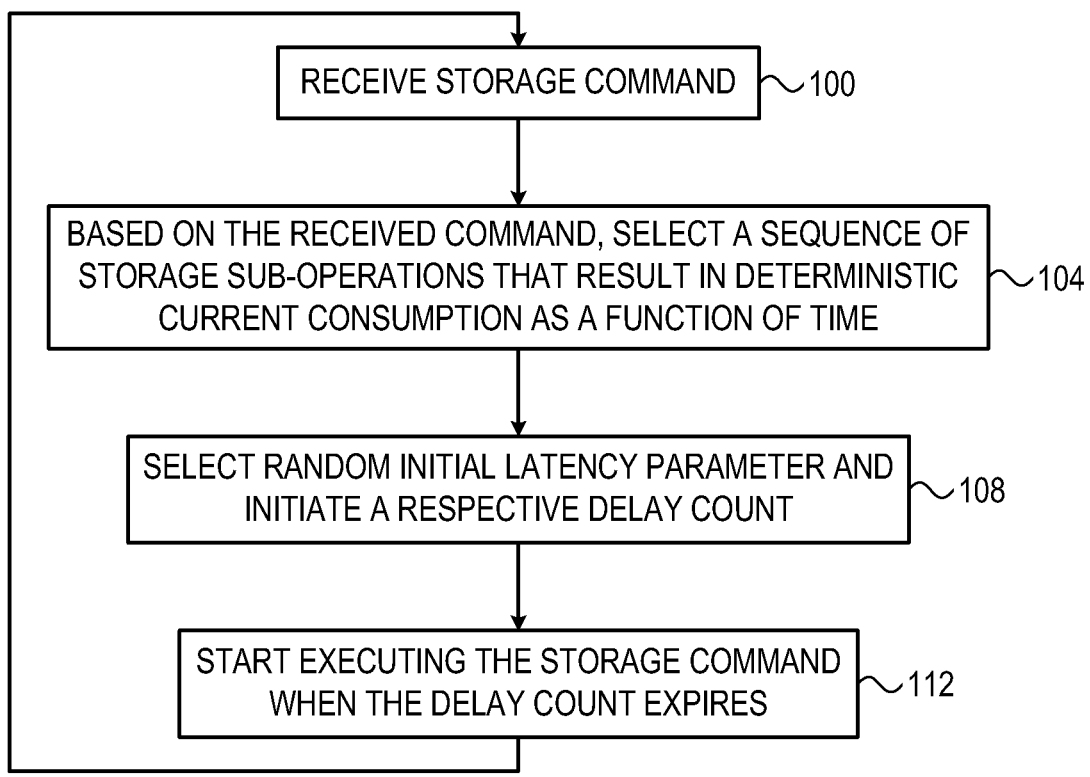
FIG. 3 is a flow chart that schematically illustrates a method for achieving predictable statistics of current consumption in a storage system, in accordance with an embodiment of the present invention.

FIG. 3 is a flow chart that schematically illustrates a method for achieving predictable statistics of the current peaks in a storage system, in accordance with an embodiment of the present invention. In the present example, the method is executed by memory device 34. In alternative embodiments, however, the method can be executed, at least partly, by SSD controller 30.

In some embodiments, memory device 34 holds types definitions for the various storage commands it is configured to handle. A storage command of a given type can be executed by R/W unit 58 by applying a respective sequence of internal operations (e.g., a sequence of P&V operations). Such a sequence of operations, however, is typically not unique, and to execute a storage command of a given type, the R/W unit may select to execute one of multiple sequences of internal operations (e.g., each sequence corresponds to a different number of P&V iterations).

In an embodiment, memory device 34 additionally defines for each type of storage command a respective nominal current waveform, so that when executing the storage command, the waveform of the actual current consumption deviates from the waveform of the nominal current by no more than a predefined maximal deviation. Examples of parameters in which current waveforms may deviate include, for example, the number of current peaks, peaks widths and gap durations between peaks, as described in FIG. 2 above.

The method of FIG. 3 begins with memory device 34 receiving a storage command, at a command reception step 100. The memory device typically receives the storage command, which is possibly destined to multiple memory devices, from SSD controller 30. At a selection step 104, based on the type of the received storage command, R/W unit 58 of the memory device selects a respective sequence of internal operations to be executed, so that when executed results in deterministic current consumption (e.g., in terms of waveform deviation from the nominal waveform).

At a delay selection step 108, the R/W unit in the memory device selects a random latency parameter, and delays the actual execution of the storage command to start at the selected latency, at an execution step 112. The method then loops back to step 100 to receive subsequent storage commands.

When the execution of storage commands is configured in accordance with the above conditions, the statistical distribution of the overall current consumption of SSD 24 is well defined. For example, it is possible to calculate the probability that the overall current consumption will exceed a certain level, the probability that power peaks will coincide in a certain number of memory devices, or the probabilities of various other events.

For example, in many cases the peak current is specified over a given time period, e.g., over a 1 µs interval, a 10 µs interval and a 100 µs interval, wherein the permitted peak current over 1 µs is higher than over 10 µs, and the permitted peak current over 10 µs is higher than over 100 µs. Given the random delay, the peak duration and gap between peaks, the probability to exceed the permitted peak current (of the entire SSD) for each interval length can be calculated. This knowledge of the statistical distribution can be used, for example, for designing the power supply circuitry of the SSD, or for any other purpose.

The method described in FIG. 3 above is an exemplary method, and other methods can be used in alternative embodiments. For example, instead of executing by memory device 34 alone, at least part of the method can be executed by SSD controller, 30. For example, the SSD controller may select the random latency parameter at step 108 and send the parameter to the respective memory device.

Although the embodiments described herein mainly address controlling power consumption peaks in memory systems, the methods and systems described herein can also be used in other applications, such as in any system comprising multiple elements that operate asynchronously with one another, such as, for example a system having multiple line drivers, or a multi-processor system.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
  in a storage system that includes multiple memory devices, receiving a given type of storage command;
  selecting a sequence of sub-operations dependent upon the given type;
  generating a pseudo-random number; and
  after delaying for a time dependent upon the pseudo-random number, executing in the memory devices the sequence of sub-operations, wherein parameters of a waveform of an actual current consumption corresponding to the execution of the received storage command deviates from parameters of a nominal current waveform defined for the given type by no more than a predefined deviation.

2. The method according to claim 1, wherein the waveform of the actual current consumption and the nominal current waveform each comprises one or more current peaks, and wherein the predefined deviation corresponds to deviation in one or more parameters characterizing the current peaks.

3. The method according to claim 2, wherein the predefined deviation corresponds to a maximal difference between a first number of the current peaks in the waveform of the actual current consumption and a second number of the current peaks in the nominal current waveform.

4. The method according to claim 2, wherein the predefined deviation corresponds to a maximal difference between gap interval durations that separate adjacent current peaks in the waveform of the actual current consumption and in the nominal current waveform.

5. The method according to claim 2, wherein the predefined deviation corresponds to a maximal difference between respective widths of the current peaks in the waveform of the actual current consumption and in the nominal current waveform.

6. The method according to claim 1, wherein generating the pseudo-random number comprises generating the pseudo-random number using a pseudo-random number generator circuit.

7. A storage system, comprising:
  multiple memory devices; and
  storage circuitry, which is configured to:
    receive a given type of storage command;
    select a sequence of sub-operations dependent upon the given type;
    generate a pseudo-random number; and
    after a time delay dependent upon the pseudo-random number, execute in the memory devices the sequence of sub-operations, wherein parameters of a waveform of an actual current consumption corresponding to the execution of the received storage command deviates from parameters of a nominal current waveform defined for the given type by no more than a predefined deviation.

8. The storage system according to claim 7, wherein the waveform of the actual current consumption and the nominal current waveform each comprises one or more current peaks, and wherein the predefined deviation corresponds to deviation in one or more parameters characterizing the current peaks.

9. The storage system according to claim 8, wherein the predefined deviation corresponds to a maximal difference between a first number of the current peaks in the waveform of the actual current consumption and a second number of the current peaks in the nominal current waveform.

10. The storage system according to claim 8, wherein the predefined deviation corresponds to a maximal difference between gap interval durations that separate adjacent current peaks in the waveform of the actual current consumption and in the nominal current waveform.

11. The storage system according to claim 8, wherein the predefined deviation corresponds to a maximal difference between respective widths of the current peaks in the waveform of the actual current consumption and in the nominal current waveform.

12. The storage system according to claim 7, wherein to generate the pseudo-random number, the storage circuitry is configured to generate the pseudo-random number using a pseudo-random number generator circuit.

13. A memory controller, comprising:
  a pseudo-random number generator circuit configured to generate a pseudo-random number; and
  a processor configured to generate and send a given type of storage command to multiple memory devices coupled to the memory controller, the given type of storage command including information determining a sequence of sub-operations to be selected by the multiple memory devices;
  wherein the generated pseudo-random number specifies a time delay after which the multiple memory devices execute the sequence of sub-operations, wherein parameters of a waveform of an actual current consumption corresponding to the execution of the received storage command deviates from parameters of a nominal current waveform defined for the given type by no more than a predefined deviation.

14. The memory controller according to claim 13, wherein the waveform of the actual current consumption and the nominal current waveform each comprises one or more current peaks, and wherein the predefined deviation corresponds to deviation in one or more parameters characterizing the current peaks.

15. The memory controller according to claim 14, wherein the predefined deviation corresponds to a maximal difference between a first number of the current peaks in the waveform of the actual current consumption and a second number of the current peaks in the nominal current waveform.

16. The memory controller according to claim 14, wherein the predefined deviation corresponds to a maximal difference between gap interval durations that separate adjacent current peaks in the waveform of the actual current consumption and in the nominal current waveform.

17. The memory controller according to claim 14, wherein the predefined deviation corresponds to a maximal difference between respective widths of the current peaks in the waveform of the actual current consumption and in the nominal current waveform.

* * * * *